United States Patent [19]

LaVallee et al.

[11] Patent Number: 4,475,194
[45] Date of Patent: Oct. 2, 1984

[54] DYNAMIC REPLACEMENT OF DEFECTIVE MEMORY WORDS

[75] Inventors: Russell W. LaVallee, Poughkeepsie; Philip M. Ryan, Hopewell Junction; Vincent F. Sollitto, Jr., Rhinebeck, all of N.Y.

[73] Assignee: International Business Machines Corporation, Armonk, N.Y.

[21] Appl. No.: 363,700

[22] Filed: Mar. 30, 1982

[51] Int. Cl.³ .......................................... G11C 11/40
[52] U.S. Cl. ..................................... 371/10; 364/200;
365/200; 371/11; 371/38
[58] Field of Search ...................... 371/10, 11, 13, 38;
365/200, 230; 364/200, 900

[56] References Cited

U.S. PATENT DOCUMENTS

| | | | |
|---|---|---|---|
| 4,010,450 | 3/1977 | Porter et al. | 371/11 |
| 4,150,428 | 4/1979 | Inrig et al. | 371/10 |
| 4,310,901 | 1/1982 | Harding et al. | 371/10 |
| 4,376,300 | 3/1983 | Tsang | 371/10 |

Primary Examiner—Jerry Smith
Assistant Examiner—M. Ungerman

Attorney, Agent, or Firm—Sughrue, Mion, Zinn, Macpeak & Seas

[57] ABSTRACT

A single error correcting memory is constructed from partially good components on the design assumption that the components are all-good. Those small number of logical lines containing double-bit errors are replaced when detected with good lines selected from a replacement area of the memory. The replacement area is provided by a flexibly dynamically deallocated portion of the main memory so that it can be selected from any section of the original memory by inserting the appropriate page address in the replacement-page register. With such a memory architecture until the first double-bit error is detected (either in testing or actual use) all pages may be used for normal data storage. When such an error is detected some temporarily unused page in the memory is deal-located, that is rendered unavailable for normal storage, and dedicated to providing substitute lines. The same procedure is followed for subsequent faults. If the replacement area itself becomes defective, a different page may be chosen to provide substitute lines simply by providing a different address in the replacement page register.

8 Claims, 3 Drawing Figures

LINE REPLACEMENT FUNCTION DIAGRAM

FIG. 2
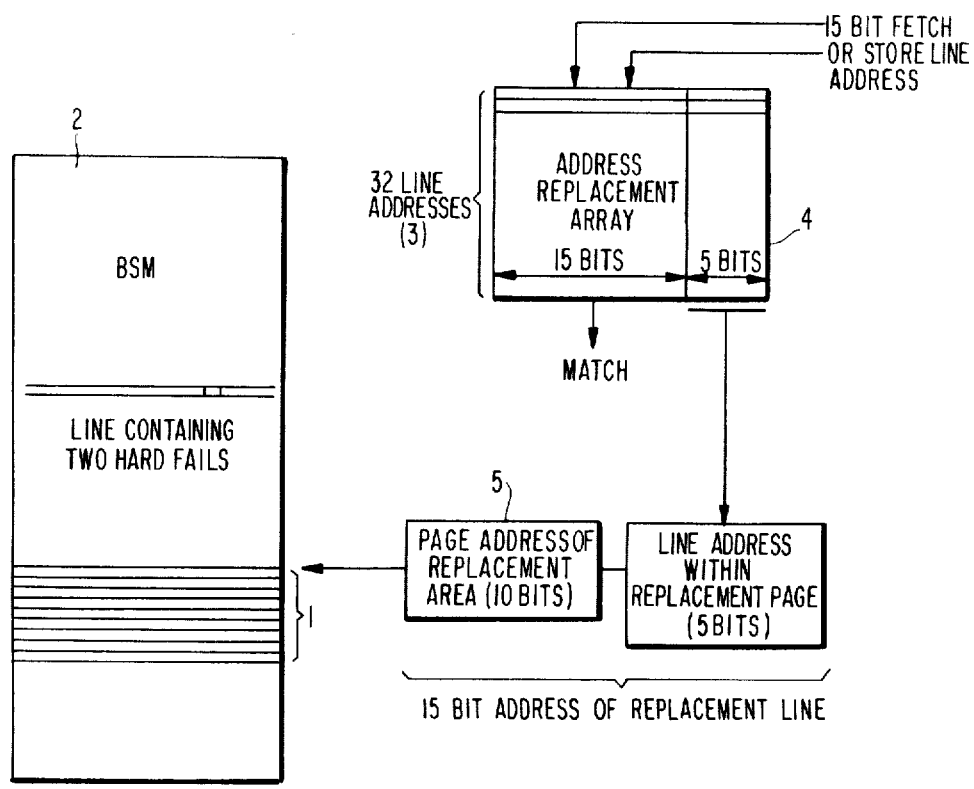
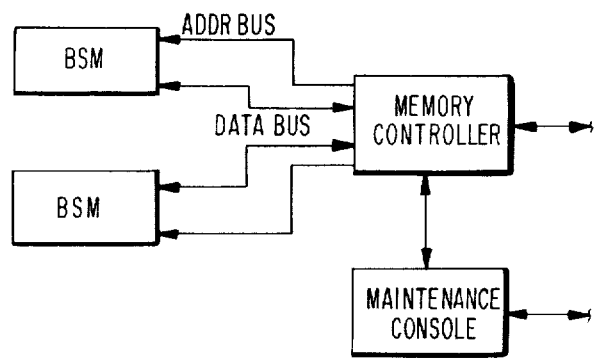
TYPICAL LARGE-SYSTEM MEMORY CONFIGURATION
FIG. 1

LINE REPLACEMENT FUNCTION DIAGRAM

DYNAMIC REPLACEMENT OF DEFECTIVE MEMORY WORDS

BACKGROUND OF THE INVENTION

1. Field of the Invention

This invention relates to a data storage system, and particularly to a system of efficiently using memory storage areas as replacements for defective areas in a digital memory.

2. Prior Art

Very large data storage systems typically employ a number of identical memory or storage elements which are combined into an overall memory system. A number of basic storage modules (BSM) are arrayed each having its own address bus and data bus coupling the BSM memory to a memory controller. Each BSM includes in addition to a number of memory array devices, buffers, terminators, and ancillary timing and control functions. The manufacture of memory array devices per se is characterized by high rates of rejection, that is, components that are not initially perfect. The mass production of information storage devices having a large number of semi-conductor memory cells integrated onto a single chip is therefore still the subject of low yield rates since, if any one of the memory cells is rendered inoperative, the entire array which includes that inoperative memory cell is also rendered inoperative. Yield rates at the present level of technology in the manufacture of integrated circuit elements with initially perfect devices remains less than 50%. Attempts to increase the yield rate have been frustrated by the continued growth in the number of cells on each chip with the attendant probability of defects increasing as the number of elements in the circuit similarly increases.

Given cost factors, techniques to use imperfect memories have been proposed as a means to increase yield rates. That is, attempts have been made to utilize memory systems having defective components. A typical prior art approach is to employ so-called "discretionary" wiring which involves individual wiring around bad memory locations. While this technique allows defective memory modules to be utilized, it introduces additional aspects of expense and further production problems. The technique requires extensive fault testing and labor.

Reference is made to U.S. Pat. Nos. 3,644,902; 3,714,637; 3,765,001; and 3,781,826 relating to a method of using a partially good memory. The scheme increases effective yield but sacrifices usable bits which exist in quadrants or octants containing bad cells and requires more chips than all-good BSM's. The technique also requires additional space, power and cooling and introduces design and manufacturing complexities. Furthermore there is no known method of applying this approach to recovering from faults which develop after the BSM has been assembled.

Other techniques also recognize that memories with defective storage locations may be utilized, for example, by simply skipping those portions of the memory (See: IBM Technical Disclosure Bulletin, Vol. 20, p. 1841, (1977)) or by the replacement of defective memory locations with spare locations from a second, dedicated, redundant memory region (See: IBM Technical Disclosure Bulletin, Vol. 12, p. 1441 (1970)). The use of dedicated redundant regions may also occur in substitute memory locations of the main memory (See: U.S. Pat. No. 4,051,460).

In other prior art systems, a recognition exists that undedicated memory locations of the main memory may be used as a replacement for faulty memory modules. The substitute module can, for example, be selected as a replacement because of its low use in the overall system operation. In U.S. Pat. No. 4,150,428, the designation of a memory module as a substitute memory occurs prior to detection of faults in other memory modules. The substitute memory module is then loaded with data substantially identical to that of the faulty module after a fault has been detected. Examples of substitute modules of low priority are, for example, those having high addresses in a read/write operation or scratch-pad memory areas.

U.S. Pat. No. 3,633,175 shows a defect tolerant memory having a main memory portion and an auxiliary memory portion. A content addressable memory (CAM) is provided for storing the address of defective locations in the main memory. Additionally, the addresses in the auxiliary memory containing defect free data are stored. Hence, during a read operation, before the data in the system's memory address register is delivered to an address decoder and driver for the operation of the main memory, the CAM compares the address to be accessed with addresses of defective main memory locations which it has stored therein. Should the comparison yield an address of an address stored in the CAM, it then delivers an auxiliary address to the address decoder driver to direct the information exchange to the spare address location that has been assigned. As a result, a defect-tolerant memory system is defined wherein the use of the CAM renders the operation of the system "transparent" to the use of two memories.

In that regard, U.S. Pat. No. 3,633,175 recognizes that the main memory M1 and the auxiliary memory M2 can either be portions of a memory M, or can be constructed as physically separated entities, that is, on separate integrated circuit chips or separate magnetic memory structures. However, irrespective of the location of the two memories, the '175 patent dedicates two areas with the auxiliary memory being reserved to contain data which has been previously stored in defective locations in the main memory.

Accordingly, while the prior art has recognized the use of partially good components in constructing memory systems, in each case the system architecture is predisposed to a design philosophy requiring either inordinately large memory units or separate dedicated memory modules as reserve blocks. The design criteria in those systems utilizing spare locations or specific reserve blocks thereby still is dictated by a formal requirement of at least a partially perfect portion of the memory. While partially defective components may be utilized, the resulting system tends to be larger than required and therefore relatively inefficient.

It is therefore an object of this invention to provide a system of facilitating the use of memories having defective locations without increasing the overall size of the memory.

It is another object of this invention to provide a memory that is designed and implemented as if all components were perfect.

Yet another object of this invention is to provide a defect tolerant memory that operates without loss of efficiency when defects are encountered during normal use.

A further object of this invention is to provide a defect tolerant memory system that is more economical in production yield rates than conventional memory systems.

SUMMARY OF THE INVENTION

The present invention proceeds from a different system architecture hypothesis than recognized in the prior art. Specifically, the present invention utilizes partially good components in the construction of a single error correcting memory which is configured as if all components were perfect. The invention proceeds from a recognition that in the use of partially good components, the organization and failure mechanisms of such memories indicate that approximately one-half of all uncorrectable errors (UE) involve the alignment of two failures within only a single double-word of memory. Moreover, a large number, perhaps half of the remaining errors, involve a relatively small number of double-words containing aligned failures.

Given this recognition, the relatively small number of logical lines containing double-bit errors are replaced with good lines in any replacement area of the memory. In contrast to the prior art, however, the replacement memory is provided by a flexibly dynamically deallocated portion of the main memory. The replacement area is therefore selected from any section of the original memory by inserting the appropriate page address in a replacement-page register. A defect tolerant memory is thus provided by accepting the defects and using any other available portion of the memory as storage until repair or some form of error correction is performed.

In accordance with the present invention, when an uncorrectable error (two aligned hard failures) is detected during a read operation, the system attempts recovery by utilizing well known techniques of single error correction and double error detection (SEC-DED). During the recovery sequence, if two hard errors are detected, a determination of the correct bit pattern for the data word in error is made and the corrected data is then sent to a memory controller for direct insertion into the line of data. In addition, the memory controller selects a line address in a selected replacement area of the memory to replace the line which is now known to contain a double-error. The system then writes both the line-address of the replaced line and the low-order 5-bits of the corresponding replacement line within the selected replacement area. This is subsequently used for address comparison. The memory then performs a write cycle storing the now correct line of data into the replacement line and the program is then restarted from the last check point.

Each subsequent access to the memory, whether a read operation or a write operation, then includes a test of the line address referenced against those addresses stored in the line replacement address array. If there is a match, the appropriate line in the replacement area is accessed. Should the replacement area become faulty, a different portion of the memory may then be designated as a new replacement area by inserting a new address into the replacement-page register.

In accordance with the present invention, the system architecture is built on the assumption that components are all good. For replacing lines which become faulty in field use, the address replacement array can be kept very small because the substitutions are made on a temporary basis, that is, only until the next time repair action is scheduled. When repair occurs, the faults no longer align and no line substitutions are required. The replacement page is returned to normal service and system operation proceeds as though all areas are perfect until the next UE is detected. Some prior art addresses ways of improving manufacturing efficiency of using defective components. Other prior art handles faults which develop after the memory is placed in operation. This invention is applicable to both problems.

This invention will be described in greater detail by reference to the accompanying drawing and a description of the preferred embodiment which follows.

BRIEF DESCRIPTION OF THE DRAWINGS

FIG. 1 is a schematic drawing showing the components in a large memory system;

FIG. 2 is a schematic system drawing showing the line-replacement configuration in accordance with the present invention.

DESCRIPTION OF THE PREFERRED EMBODIMENT

Figure 3:
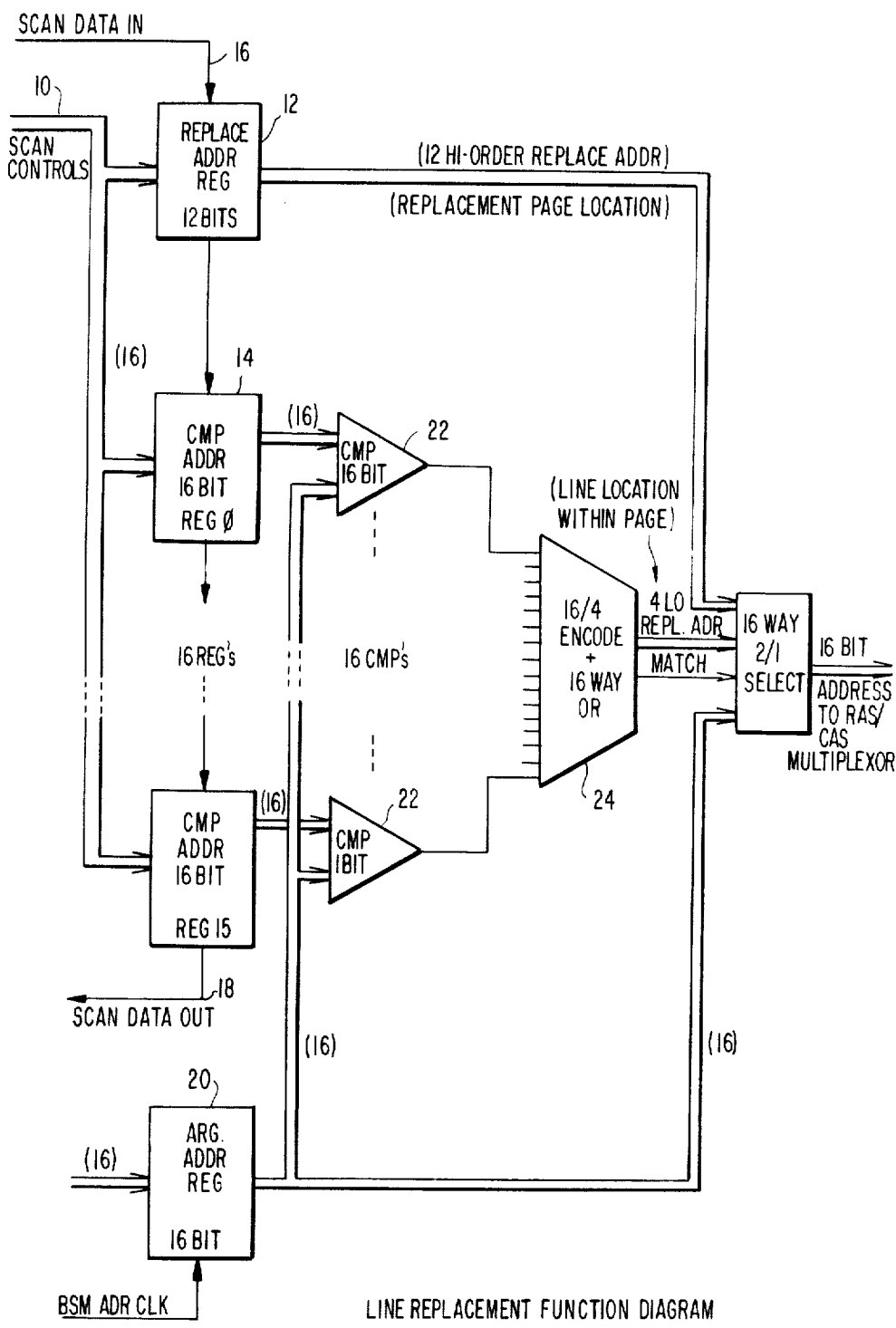
FIG. 3 is a more detailed schematic drawing showing a functional diagram of another implementation of line replacement.

The present invention is applicable to systems employing large memories. Such memories are basically constructed as shown in FIG. 1 utilizing a number of basic storage modules (BSM) which each contain memory array devices in addition to buffers, terminators and some ancillary timing and control functions. The BSM's are coupled to a memory controller by means of an address bus and a data bus thereby controlling the transfer of data between the BSM and the remainder of the system. In accordance with known operations, during a write sequence, the memory controller transmits data, typically a line of 1152 bits, to buffers within the BSM, then presents a line address and initiates a write-memory cycle. During a read operation, the controller presents a line address to the BSM, initiates a read-memory cycle and on completion of that cycle, transfers data from the BSM buffers to its destination within the system.

In such systems, the data transfer is typically, initially, tested by error correcting code (ECC) logic on 72-bit boundaries. The 72-bit block forms a doubleword boundary and the ECC logic corrects single bit errors during transfer. Errors of more than a single bit are flagged as uncorrectable (UE) errors. The flagging of multiple bit errors is known as doubleerror detection (DED) in which various techniques of recovery based on a determination of the combination of the multiple bit error is attempted. For example, one technique of recovery can be attempted on errors which are a combination of one hard and one soft (unrepeatable) error. In such a system, a diagnostic routine on the double word of the memory which produced the UE occurs to identify the single hard error and then inverts that bit in the saved double-word containing the UE. The ECC is then used to correct the soft error and the now correct data word is written back into the memory. The program is then restarted from the last check point.

Techniques of ECC are well known in the technology, for example, as described in Hsiao, "A Class of Optimal Minimum Odd-Weight-Column SEC DED Codes", IBM J. Res. & Dev., Vol. 14, p. 396 (1970) et seq., with combinations of SEC/DED established in literature, for example, as shown in U.S. Pat. Nos. 3,656,107 and 4,139,148.

An analysis of the organization and failure mechanism which exists in partially perfect memories has indicated that approximately one-half of all UE's involves the alignment of two failures within only a single double-word of memory. The remainder involve a relatively small number of double-words containing aligned failures. Hence, there are generally a relatively small number of logical lines which contain double-word errors in the environment of a very large memory system. The deallocation of a complete page of, for example, 4096 bytes, is therefore an inefficient technique of coping with the appearance of the small number of UE's. The present invention perceives the organization of large memory systems involving the use of BSM's and proceeds on the assumption of that all the components are perfect and replacement is merely of the failed double-word (8 bytes) or a complete fail line (128 bytes) with a similar element that does not contain a UE.

Referring now to FIG. 2, an overall schematic example of a line replacement configuration in accordance with the invention, is utilized. A typical BSM 2 may typically have 512 K data words of 8 bytes each. Each BSM typically has 1,024 pages with each page having 32 lines.

The BSM 2 is constructed as though all of the components are perfect and accordingly, when an uncorrectable error (UE) is detected, the system maintenance console (not shown) or recovery hardware will attempt recovery of that error. The patterns encountered will indicate whether the UE is recoverable, that is, one hard and one soft or two hard errors, or not, in the case of two soft errors. During the recovery sequence against two hard errors, the hardware determines the correct bit pattern for the data word in error and will send the corrected data word to the memory controller for direct insertion into the line of data. The recovery sequence is typically rather time-consuming having an adverse effect on system performance, so it is desirable to replace the faulty line.

In addition, as shown in FIG. 2, the present invention perceives that a line address in a selected replacement area 1 of the memory 2 will be used to replace the line now known to contain a double error. The system then writes both the line-address 3 of the replaced line and the low-order 5-bits of the corresponding replacement line within the selected replacement area 1. This is written into an array of latches 4 which will subsequently be used for address comparison. As shown in FIG. 2, the replacement area is typically a page of 32 contiguous replacement lines.

While the address replacement array is shown in FIG. 1 as existing separately from the memory, typically in the memory controller, it is understood that the comparison array may be implemented either within the BSM, in the memory controller, or split between them. This choice is made as a function of design trade-offs which include aspects of space, power, packaging technology, timing, and impact on the completed design. The recovery hardware then causes the memory to perform a write cycle storing the nowcorrect line of data into the replacement line and the program is restarted from its latest checkpoint.

On every subsequent access to memory 2, either a read or write operation, the line-address reference is first tested against those stored in the line-replacement array. If a match is found, reference is made to the appropriate line in the replacement area.

The technique of line replacement is particularly useful in deferring the need for repair. In this context, it provides for on-line recovery of most uncorrectable errors together with temporary fixing of bad pages without requiring page deallocation. When the number of replaced lines approaches the capacity of the replaceable lines, a single repair action may be scheduled for some convenient time to clear the major alignment defects and line-replacement maybe used to replace a few remaining bad lines.

Implementation of FIG. 2 with currently available logic may cause access delay to normal (nonreplaced) lines of memory. FIG. 3 shows an implementation of the line replacement concept using fewer replacement lines and hence a smaller number of stages of logic delay. The actual implementation must balance the number of replacement lines against the acceptable delays in access. In the FIG. 3 implementation, the number of replacement lines is reduced from 32 lines of FIG. 2, to 16 lines. Also, a 16 bit address bus is used.

Referring now to FIG. 3, one technique of implementation of the present invention is shown for the purpose of line replacement. In accordance with the present invention, line replacement is achieved to dynamically side-step references to storage locations containing known multi-bit failures, that is, uncorrectable errors are attained by translating the reference to a preassigned location known to be good. In order to attain this function, the BSM address bus is subjected to modification. The address bus can generally address a minimum of 16 double words (line). In order to accomplish this modification, logic is required in the BSM address path to detect and replace known bad references. Software in the system is needed to manage the original detection, replacement assignment and initialization of the BSM replacement hardware is required. An area of the memory must be used for replacement storage. Following initialization of the technique, the BSM function is transparent to the system.

FIG. 3 shows the function of a 16 address replacement implementation for a 16-bitwide address bus 10. Initially, a 12-bit register 12 contains the page address (16 line group) of the replacement storage address and 16 compare registers 14 are used containing the addresses of up to 16 bad lines. The registers are initialized by maintenance system software via scan controls thereby receiving data from the scan data in line 16 and the scan data out line 18.

An argument address register 20 latches the incoming storage address for each memory operation. The 16-bit-wide address bus is shown in FIG. 3 forming one input to the argument address register 20. The argument address is compared against the 16 compare addresses in the comparator array 22. If there is a match, the replacement address comprising 12 bits and the encoded results of the 16 compare operations (4 bits) are gated out of the function. Encoding of the 16 compare results from the comparator array 22 takes place utilizing a 16/4 encoder and a 16-way OR gate array 24. Such a logical array is well known in the technology and need not be illustrated. As shown in FIG. 3, a match of the 12-bit replacement address and the 4-bit encoded results of the comparator are gated out while, if there is no match, the argument address is gated out. By using the encoded compare results from the logical array 24 to obtain the line address portion of the replacement address, the position of each compare register in the scan ring has a fixed association with alignment in the replacement page.

Each of the compare registers 22 must be prevented from generating a spurious replacement signal when it is not being used. This may be accomplished by loading the compare register with the replacement address register contents in the high order 12-bits and the compare registers 4-bit position address in the low order 4-bits. Consequently, a system reference into an unused line in the replacement page via the argument address will generate a compare and a replacement value equal to the argument value. The implementation therefore illustrates the trade-off between the size of the logic array and acceptable delays in access.

In accordance with this invention, replacement is accomplished dynamically, on-line, by using a flexibly dynamically deallocated portion of the memory. By utilizing such system architecture substantial benefits result. First, in conjunction with established techniques of double error recovery, task aborts due to aligned array failures can be almost totally avoided. Consequently, improvement in system throughput and user satisfaction results.

A more substantial benefit occurs by the efficient replacement of failed storage areas. In conjunction with routine established use of SEC-DED ECC logic, the construction of memories from only partially good components results without requiring the design and manufacturing complexities of partial-good design as practiced in prior art. That is, the memory is constructed on the assumption that all of the components are perfect and there is no allocation of a separate reserve block as a substitute memory or the use of a memory which is unduly large since replacement of defective words/lines occurs on line as opposed to skipping defective locations.

As a result, the small number of lines containing double-bit errors are replaced with good lines elsewhere in the memory. The lines which are replaced represent only a fraction of 1% of the total memory capacity. Consequently, in accordance with the present invention, the memory contains fewer components, fewer connections and therefore consumes less power than those typically designed to use partially good components. The construction of a large memory in accordance with the present invention results in a more reliable system wherein manufacturing and testing logistics are simplified. In that sense, the components are tested against a threshold of bad bits, either passing or failing. Such a criterion, as opposed to testing and sorting components into categories of all-good or various partial goods, simplifies both BSM design and manufacturing logistics.

This invention is applicable in two overlapping ways. First, a BSM can be built from "mostly good" components having a few isolated bad cells, followed by testing to locate the few words in which the faults align, then make more or less permanent line substitutions for these few bad words. Second, temporary line substitutions can be made on line as new faults develope and cause alignments in field operation. At a convenient time repair of the new faults is made while restoring the substitution line capacity.

The technique of line substitution may be applied both to the manufacture of memories containing some faulty components, replacing those lines which contain faults which align (here the substitutions are effectively permanent) and to avoidance of performance degradation and deallocation of pages due to alignment of field errors (here the substitutions are temporary, until repair or other recovery action is performed).

It will be understood that the above description of the present invention is susceptible to various modifications, changes and adaptions, and the same are intended to be comprehended within the meaning of the appended claims.

I claim:

1. A memory system accessible in logical lines comprising:
   a memory;
   means for determining the presence of an uncorrectable error in a logical line accessed from said memory;
   means for dynamically deallocating an undedicated portion of said memory and on-line directing all future access from said logical line to said undedicated portion of said memory; and
   means for storing corrected data in said undedicated portion of said memory.

2. A memory system, accessible in logical lines for reading or writing data therein comprising:
   a memory;
   means for determining the presence of an uncorrectable error in a logical line of data read from said memory;
   means for dynamically deallocating an undedicated portion of said memory containing at least one logical line and for on-line substituting said logical line for said logical line containing an uncorrectable error whenever logical line containing an uncorrectable error is addressed; and
   means for storing corrected data in said substituted logical line.

3. The apparatus of claims 1 or 2 wherein said memory system comprises at least one basic storage module, a memory controller controlling the transfer of data between the basic storage module and the remainder of the system and a maintenance console.

4. The apparatus of claim 3 wherein said maintenance console includes error correcting code means for determining the presence of an uncorrectable error.

5. The apparatus claim 3 wherein said memory controller includes a line replacement array containing addresses of said logical line and said logical line containing an uncorrectable error.

6. The apparatus of claim 3 wherein said basic storage module includes a line replacement array containing addresses of said logical line and said logical line containing an uncorrectable error.

7. A method of accessing a memory in logical lines some of which may contain uncorrectable errors comprising the steps of:
   fetching a logical line from said memory and determining the presence or lack thereof of an uncorrectable error;
   dynamically deallocating an undedicated portion of said memory if an uncorrectable error is determined; and
   comparing line addresses on future accesses to said memory to determine whether the logical line accessed is the line known to contain said uncorrectable error and if comparison results, on-line substituting the line address of said undedicated portion for the address of the line to be accessed.

8. The method of claim 7 further comprising the steps of correcting any uncorrectable error data and storing corrected data at the line address in said undedicated portion.

* * * * *